United States Patent [19]

Menashi et al.

[11] 3,933,435
[45] Jan. 20, 1976

[54] APPARATUS FOR DIRECT MELT SYNTHESIS OF COMPOUNDS CONTAINING VOLATILE CONSTITUENTS

[75] Inventors: Wilson P. Menashi, Lexington; Joseph F. Wenckus, Needham; Roger A. Castonguay, Salem, all of Mass.

[73] Assignee: Arthur D. Little, Inc., Cambridge, Mass.

[22] Filed: June 3, 1974

[21] Appl. No.: 475,780

Related U.S. Application Data

[60] Continuation-in-part of Ser. No. 365,135, May 30, 1973, Pat. No. 3,825,242, which is a division of Ser. No. 169,315, Aug. 5, 1971, Pat. No. 3,777,009.

[52] U.S. Cl. ............. 23/252 R; 23/273 SP; 23/290; 432/262
[51] Int. Cl.².... B01D 9/00; B01J 3/00; F27B 14/10
[58] Field of Search ............. 23/252 R, 290, 277 R, 273 SP; 266/34 R, 39; 432/262; 219/10.67; 423/299

[56] References Cited
UNITED STATES PATENTS

| | | | |
|---|---|---|---|
| 1,379,187 | 5/1921 | Kaufman | 23/277 R |
| 2,631,091 | 3/1953 | Kuentzel et al. | 23/290 |
| 3,118,737 | 1/1964 | Blocher, Jr. | 23/252 R |
| 3,552,931 | 1/1971 | Doherty et al. | 23/273 SP |
| 3,627,499 | 12/1971 | Le Duc et al. | 23/273 SP X |
| 3,825,242 | 7/1974 | Menashi et al. | 266/39 |

Primary Examiner—Joseph Scovronek
Attorney, Agent, or Firm—Bessie A. Lepper

[57] ABSTRACT

Apparatus for the melt synthesis of inorganic compounds from elemental reactants, at least one of which is highly volatile at the temperature of the reaction. An enclosure means defining a reaction chamber and a reservoir-closure means containing the volatile elemental reactant form the reaction vessel which is sealed by a combination mechanical-liquid seal which is of a character to permit diffusion by high-pressure gas through it. Heating means are provided to effect at least three heating regimes: (I) liquefaction of a liquid sealant, (II) formation and maintenance of a molten reaction mass, and (III) heating of the volatile elemental reactant to vaporize it.

18 Claims, 6 Drawing Figures

APPARATUS FOR DIRECT MELT SYNTHESIS OF COMPOUNDS CONTAINING VOLATILE CONSTITUENTS

This application is a continuation-in-part of our copending application Ser. No. 365,135 filed May 30, 1973, now U.S. Pat. No. 3,825,242, issued July 23, 1974, which was in turn a divisional application of our Ser. No. 169,315 filed Aug. 5, 1971, now U.S. Pat. No. 3,777,009.

This invention relates to method and apparatus for synthesizing inorganic materials formed of two or more elemental constituents, at least one of which is volatile at elevated temperatures, and more particularly to the synthesis of such materials as polycrystalline GaP.

During the past decade there has developed a growing interest in various uses for the Group III-V, Group II-VI and Group II-IV-VI compounds because of their unique quantum-electronic properties. Thus these materials may be used as the detector elements in infrared detectors, as light-emitting diodes, as infrared window elements, and in Gunn diodes and Hall generators. Exemplary of such Group III-V compounds are those formed by reacting one or more of such Group III elements as gallium and indium with one or more of such Group V elements as phosphorous, arsenic and antimony. Exemplary of such Group II-VI compounds are those formed by reacting one or more of such Group II elements as zinc, cadmium and mercury with one or more of such Group VI elements as sulfur, selenium and tellurium. Mercury-cadmium-telluride, lead-tin-telluride and lead-tin-sellenide may be cited as examples of ternary systems formed of Group II-IV-VI compounds. A number of various dopants may also be added to these intermetallic compounds. Because the quantum-electronic properties of any one such inorganic compound depend upon the ratio of the various elemental components making up the compound, it is very important to be able accurately to control these ratios and to be able to reproduce them from batch to batch.

Many of these elemental components have very high vapor pressure at elevated temperatures both in their elemental state and in their combined state, a fact which has made the synthesis of these compounds in their polycrystalline state exceeding difficult and costly. For example, the vapor pressure of arsenic over molten GaAs (m.p. 1270°C) and of phosphorus over molten GaP (m.p. 1470°C) are one atmosphere and 35 atmospheres, respectively. The vapor pressure of mercury over molten HgCdTe increases with increasing cadmium concentration from about 18 atmospheres for HgTe to above 100 atmospheres. Thus considerable technical difficulty is encountered in the preparation of these and other volatile materials, and much ingenuity is required to avoid the loss of material by volatilization which can lead to decomposition, formation of inhomogenous material, or in some cases even catastropic failure of the reaction vessel.

Although the principal difficulties of producing single crystals from the polycrystalline materials such as the arsenides, phosphides, tellurides, selenides and the like have been largely overcome by use of liquid-encapsulated crystal growing techniques, the excessive cost of the polycrystalline compounds themselves has materially hindered single crystal manufacture and use of these compounds.

In general, processes for the synthesis of these materials containing one or more volatile constituents has been based on the use of different types of sealing techniques using both solid and liquid sealing. In addition, other techniques have been described which reduce the loss of the volatile component by making use of particular thermodynamic and kinetic properties of fluids. All of these techniques, however, have inherent difficulties and limitations which may be briefly summarized.

One type of the solid sealing devices used has been in the form of sealed quartz ampoules. Quartz can be worked easily and forms an impervious diffusion barrier for most volatile species. However, its mechanical strength is limited, especially at high temperature, and sealed quartz ampoules are vulnerable to stresses caused by significant increases in internal vapor pressure, particularly during exothermic reactions. The range of application is therefore generally limited to temperatures below 1200°C and pressures below 20 atmospheres. With special precautions, such as using heavy-wall ampoules backed up by an inert gas pressure or by solid liners, it is possible to extend the pressure range somewhat higher. These are delicate techniques which often lead to catastrophic failure of the ampoule. Quartz is also susceptible to chemical attack by many constituents or by trace impurities which can further reduce its mechanical strength or cause contamination of the material.

One specific example of the use of the solid sealing method using a quartz ampoule for synthesizing polycrystalline material is a process termed the horizontal Bridgman technique in which the components are combined using vapor/liquid-phase reactions and then horizontally zone-refined to produce an ingot which is subsequently cleaned and etched. For example, polycrystalline GaP production involves the reaction of P or $PH_3$ vapor passing over molten gallium which results in a sponge-like GaP mass which generally contains excess gallium. This technique, in addition to producing inferior material, is exceedingly slow.

Another example of the use of solid sealing is in the synthesis of the ternary HgCdTe compound which is at present produced by a slow, controlled reaction of the elements in an evacuated quartz ampoule. The reaction must be carried out very slowly with continuous rocking of the ampoule to prevent overheating and vaporizing the mercury which could cause the ampoule to burst. Typical reaction cycles require about 60 to 80 hours to form the compound. Thus, producing the inorganic compounds by these prior art methods is time consuming and expensive. Moreover, the quality of the ingot is difficult to control and it is generally necessary to use an excess of the volatile component. Finally, the process demands the use of small quartz ampoules and results in low yields and small ingots. Typical processing using quartz ampoules are described in U.S. Pat. Nos. 3,366,454 and 3,649,193.

Some of the difficulties of synthesizing compounds and of producing single crystals from the polycrystalline materials such as the arsenides, phosphides, tellurides, selenides and the like have been overcome by a liquid sealing technique called liquid encapsulation. In this technique a molten layer of a liquid encapsulant, such as boric oxide ($B_2O_3$), is formed over the volatile material to maintain a liquid diffusion barrier which is backed up by an inert gas overpressure inside a high-pressure chamber or autoclave. Several compatible high-pressure materials, such as quartz, graphite or boron nitride, can be used for crucibles. This technique is particularly attractive for Czochralski pulling of high-melting point, volatile crystals such as GaP. (See for example U.S. Pat. Nos. 3,649,193 and 3,704,093 and German Offenlegungsschrifts Nos. 2,137,772 and 2,142,388.

In U.S. Pat. No. 3,704,093 there is described and claimed an improved method for synthesizing intermetallic compounds using a liquid encapsulant. By this method the reactants are placed in an open crucible and an encapsulant such as $B_2O_3$ is placed on top of them. The crucible is placed within a vessel which is then pressurized to a level equal to or above the highest vapor pressure attained by the volatile component during the reaction. The crucible is gradually moved into a heating zone, e.g., within rf coils, in a manner to first heat and melt the encapsulant and then the reactants. Through the use of the molten encapsulant and the surrounding elevated pressure, it is possible by this method to form compounds having volatile constituents, in particular those which form at the lower temperatures and are made up of constituents having lower vapor pressures at the synthesis temperature. The high-pressure capabilities of presently available high-pressure furnaces (e.g., up to about 100 atmospheres maximum) eliminate the practical use of the method of U.S. Pat. No. 3,704,093 for the synthesis of GaP. Moreover, since the encapsulant is in physical contact with the reactants (over and around them) it is not possible for some reactant systems to get sufficient heat into the encapsulant before the vapor pressure of the volatile component becomes sufficiently high to result in some loss of that component to the reactant system. In some instances one of the reactants in molten form may have a specific gravity which is materially less than that of the molten encapsulant in which case a physical inversion may take place resulting in the molten reactant becoming the top layer separated from the other reactant by a layer of encapsulant.

Among the general difficulties and limitations encountered in the use of the liquid-encapsulation technique wherein the encapsulant is in actual physical contact with the molten constituents or molten compound formed is the fact that $B_2O_3$, the most commonly used encapsulant, may contaminate the material (especially II-VI compounds) or adhere to the crystal formed and cause cracking.

Techniques which do not require the sealing of the reaction vessel have been disclosed. An example of such a technique is the synthesis of polycrystalline GaP wherein the reactants are contained within a quartz vessel equipped with a capillary tube serving as a fluid connection and pressure equalizer between the volume within the quartz vessel and the pressurized inert gas surrounding it. (See for example A. G. Fischer "Techniques for Melt-Growth of Luminescent Semiconductor Crystals Under Pressure", Journal of the Electrochemical Society Vol. 117, No. 2, pp 41C–47C (February 1970) and German Offenlegungsschrift No. 2,142,388.) The phosphorus is maintained at a temperature just sufficient to vaporize it and the resulting phosphorus vapor is brought into contact with molten gallium maintained at a temperature above that at which melt synthesis of GaP takes place. To minimize condensation and vapor transport of phosphorus vapor, the quartz vessel and the capillary tube are heated so that free phosphorus is maintained in the vapor phase inside of the quartz vessel. The capillary tube therefore serves as a means to balance the pressures inside and outside the quartz vessel and as a diffusion zone to reduce the rate of loss of phosphorus out of the quartz vessel into the "cold" high-pressure chamber. This process has several disadvantages. Among these are the continuous loss of phosphorus through the capillary which lowers the phosphorus yield and makes the process less attractive economically than if the phosphorus yield could be maintained near maximum; and the interior of the furnace in which the process is carried out, along with the auxiliary equipment contained therein, becomes contaminated with deposits of the volatile constituent which may be corrosive and which may require tedious cleanup procedures.

In our copending application Ser. No. 365,135, of which this application is a continuation-in-part, we have described improved apparatus for carrying out the synthesis of inorganic compounds from elemental reactants, at least one of which is highly volatile at the synthesis temperature. This apparatus comprises a reaction vessel having closure means which forms a mechanical seal with the vessel and also permits the use of a liquid sealant to provide a combined liquid-mechanical seal of a character which prevents the liquid sealant from entering the reaction chamber within the vessel but which permits the diffusing of high-pressure gases through the seal. This apparatus therefore possesses the advantages of a sealed system (containment of reactants) without the disadvantages of having to use a quartz ampoule or the like. Moreover, it eliminates the contacting of a liquid encapsulant with the molten reaction mass and thus eliminates the disadvantages inherent in the use of a liquid encapsulant. Finally, it eliminates the discharge of any appreciable amount of the volatile component into the pressure furnace and the necessity for extensive clean-up after runs.

In the specific apparatus embodiments of Ser. No. 365,135, the elemental reactants, e.g., gallium and arsenic are premixed in the reaction chamber of the sealed vessel prior to heating and subjected to a single heating zone. This is a completely satisfactory arrangement in such cases wherein the vapor pressure of the volatile reactant at the melt synthesis temperature is not above the safe pressure capabilities of the pressurized furnace in which the reaction vessel is located. Since presently available pressure-furnaces are capable of being pressurized up to about 100 atmospheres, the apparatus embodying the unique mechanical-liquid seal of Ser. No. 365,135 and having a single reactant chamber for premixed reactants is not practical for synthesizing GaP, for the vapor pressure of elemental phosphorus at the melt synthesis temperature of GaP (1470°C) is of the order of several hundred atmospheres. For all practical purposes, compounds formed of elements, one of which has a vapor pressure of greater than about 75 atmospheres at synthesis temperature require separate heating zones.

It would therefore be desirable to have an apparatus which embodies the advantages of the mechanical-liquid seal and which is suitable for the melt synthesis of such compounds as GaP from elemental reactants, at least one of the reactants having a vapor pressure at melt synthesis temperature greater than 75 atmospheres.

It is therefore a primary object of the invention to provide an apparatus for direct melt synthesis of inorganic compounds from elemental reactants, at least one of which has a vapor pressure of greater than 75 atmospheres at melt synthesis temperature. It is another object to provide an improved apparatus for the melt synthesis of GaP. An additional object is to provide an apparatus of the character described which permits accurate control of the composition of the compound and the reproductibility of compositions. It is another object to provide an apparatus of the character described which does not require an appreciable excess of the volatile component, does not use an encapsulant and is free from any external contamination. It is still another object to provide such an apparatus which lends itself to rapid melt synthesis of such material as polycrystalline GaP of high quality on a relatively large scale. Still another object is to provide such an apparatus which can be modified to achieve directional cooling of the reaction product.

Other objects of the invention will in part be obvious and will in part be apparent hereinafter.

The invention accordingly comprises the features of construction, combination of elements, and arrangement of parts which will be exemplified in the constructions hereinafter set forth, and the scope of the invention will be indicated in the claims.

In brief, the apparatus of this invention comprises enclosure means defining a reaction chamber to contain the nonvolatile elemental reactant, e.g., gallium and the molten reaction product, e.g., GaP, and closure means which constitutes a reservoir for the volatile elemental reactant, e.g., phosphorus. The closure means is engageable with the enclosure means through a mechanical-liquid seal of a character which prevents the liquid sealant of the liquid seal from entering the reaction chamber while simultaneously permitting the diffusing of high-pressure gases therethrough. Heating means are provided to attain three heating regimes in sequence: (I) heating the sealant to liquefy it, (II) heating the nonvolatile reactant to the melt synthesis temperature to form a molten mass and maintaining this mass at the synthesis temperature until the reaction is complete, and (III) heating the volatile reactant to a temperature sufficient to vaporize it and drive it into contact with the molten mass. The heating means may also include means to attain a fourth heating regime which constitutes gradually reducing the temperature of the bottom of the molten mass to effect controlled crystallization of the reaction product.

The isolation of the volatile elemental component in a heating zone different from that in which the nonvolatile component and subsequently the reaction mass are located is known in the prior art. See for example German Offenlegungsschrifts Nos. 2,142,388 and 2,137,772, U.S. Pat. Nos. 3,366,454 and 3,649,193 and the Fischer article previously cited. The apparatus of Offlengungsscrift No. 2,142,388 uses either a capillary connection between the reaction vessel and the furnace atmosphere or a liquid encapsulant and requires that a tubing extend from the volatile component reservoir to beneath the molten mass to deliver the vaporized volatile component for reaction. The use of the tubing introduces an added apparatus component and adds to the complexity of operation; while the capillary connection or the liquid encapsulant posses the disadvantages previously described.

In Offenlegungsscrift No. 2,137,772 and U.S. Pat. Nos. 3,649,193 and 3,366,454 the volatile component is placed either below or beside the molten mass and its vapor is permitted to rise and penetrate into the molten mass. In those cases where the volatile component is below the molten mass it may pass through a porous barrier defining a part of the bottom of the crucible containing the molten mass. Liquid encapsulation may be used to seal in the molten mass and in some cases the entire reaction system may be enclosed within a sealed quartz ampoule. In addition to requiring an excessive amount of time to complete the reaction, such apparatus possess the disadvantages associated with the use of sealed ampoules and liquid encapsulants described previously.

In contrast to this prior art apparatus using two different heating zones, the apparatus of this invention uses the minimum number of apparatus elements, provides a sealed system which is safe and readily assembled and which is capable of preventing any appreciable leak of the volatile constituent into the furnace atmosphere. The apparatus of this invention makes it possible to rapidly synthesize large-sized ignots of GaP of good quality using essentially stoichiometric quantities of elemental reactants.

For a fuller understanding of the nature and objects of the invention, reference should be had to the following detailed description taken in connection with the accompanying drawings in which FIG. 1 is a longitudinal cross section of one embodiment of the reaction vessel of this invention showing the manner in which the components making up the vessel are assembled;

For convenience in describing the apparatus of this invention, the synthesis of GaP from gallium and phosphorus will be used as illustrative. It is, of course, within the scope of this invention to use any other suitable combination of volatile and nonvolatile elemental reactants.

Figure 1:
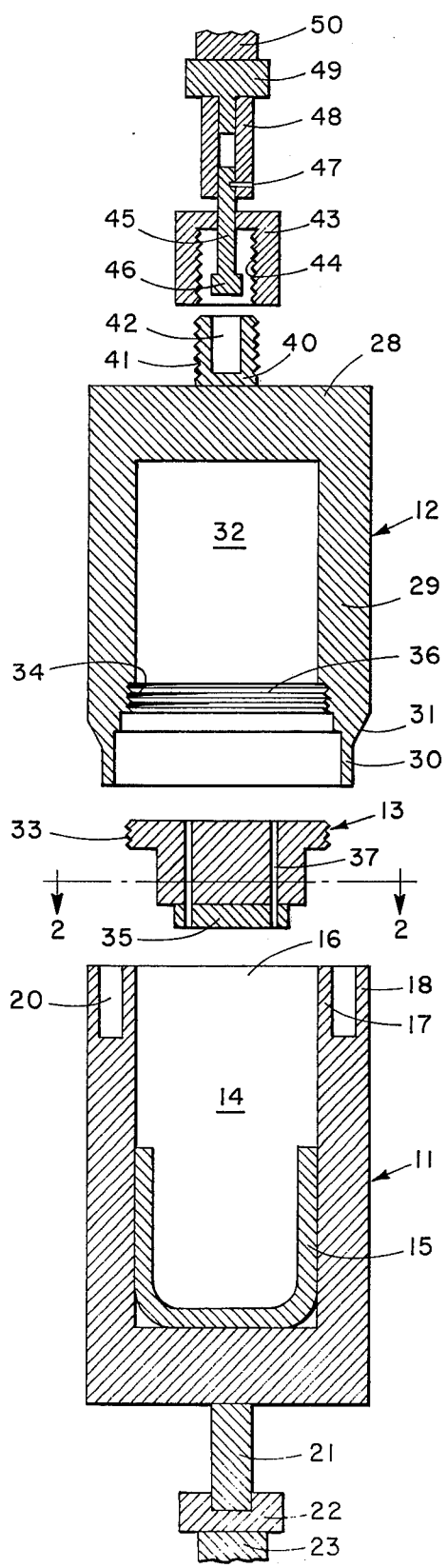

FIG. 1 illustrates one embodiment of the reaction vessel of the apparatus of this invention with the component parts disassembled. This reaction vessel, generally indicated in the drawings by reference numeral 10, comprises an enclosure means 11 and a reservoir-closure means 12 having a channeled plug 13. Enclosure means 11 defines within it a reaction chamber 14, shown in FIG. 1 to contain a removable crucible 15 for containing the molten mass (a term used hereinafter to include the molten nonvolatile constituent, gallium, as well as the molten reaction product, GaP). Enclosure means 11 has an upper access opening 16 and its upper rim has a deep groove between rims 18 and 19 to define an annular channel 20 designed to hold a liquid sealant. The enclosure means 11 has an integral supporting rod 21 suitable for engagement with a chuck 22 affixed to a load-bearing rod 23 which may be driven to impart translational, and if desired rotational, motion to the enclosure means. A suitable load-bearing rod and its driving mechanism is described in U.S. Pat. No. 3,552,931. For the synthesis of GaP, the enclosure means 11 is conveniently formed from graphite and crucible 15 from boron nitride.

Figure 2:
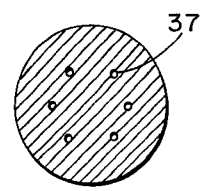
FIG. 2 is a cross section of the channeled plug of the reservoir enclosure means of FIG. 1 taken through plane 2—2 of FIG. 1.

The reservoir-closure 12 is constructed, preferably of graphite, as an open-ended cylinder having a thick-walled top 28, a thick side wall 29, and an annular skirt section 30 joined to side wall 29 through an externally frustoconically-configured section 31. Defined within the reservoir-closure 12 is a reservoir chamber 32 for containing the volatile reactant, phosphorus. This reservoir chamber is closed by plug 13 which has an upper section with threads 33 adapted to engage threads 34 cut into the internal wall of the reservoir-closure. Plug 13 has a hexagonal nut 35 affixed to the side exposed to the reaction chamber for ease in screwing it into and removing it from the open end 36 of the reservoir-closure 12. Plug 13 has a plurality of gas channels 37 (see also FIG. 2) extending therethrough to provide for fluid communication between the reservoir chamber 32 and reaction chamber 14 when the reaction vessel is assembled.

Figure 4:
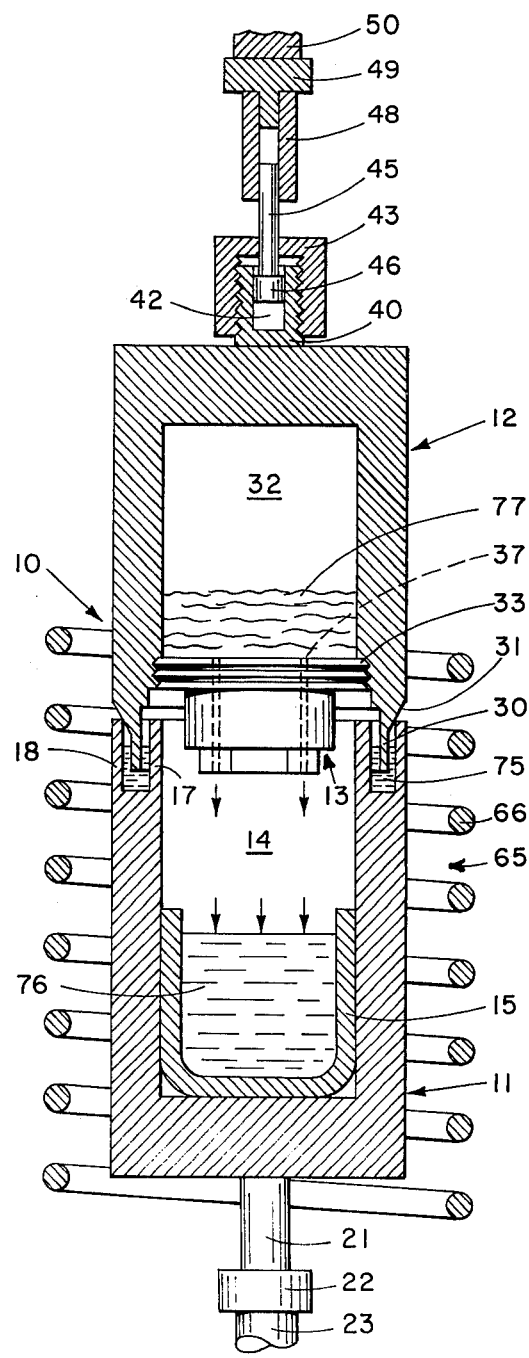
FIG. 4 is a longitudinal cross section through the reaction vessel embodiment of FIG. 1 during melt synthesis.

The skirt section 30 of the reservoir-closure is sized to fit into channel 21 of the enclosure means 11 and to define a spacing with the internal walls of both rims 17 and 18. The frusto conical section 31 is cut at an angle so that its external surface makes physical contact all around with the internal edge of rim 18 and skirt section 30 is of a length such that it does not touch the bottom of channel 20 when assembled as shown in FIG. 4 and described below.

Reservoir-closure 12 has a connector piece 40 integral with or affixed to top 28. This connector piece has external threads 41 and an internal chamber 42. A deep cap member 43 with internal threads 44 adapted to engage threads 41 has a supporting rod 45, terminating in a large-diameter head 46, slidably mounted therein. The external end of rod 45 is rigidly affixed, such as by pin 47, to a sleeve 48 which in turn is attached to a chuck 49 affixed to a load-bearing rod 50 which may be driven to impart translational, and if desired rotational, motion to the reservoir-closure. A suitable load-bearing rod and its driving mechanism is described in U.S. Pat. No. 3,552,931. Reservoir-closure 12 and plug 13, like enclosure means 11, are conveniently formed of graphite.

When cap member 43 is screwed onto connector piece 40, head 46 of supporting rod 45 may slide freely in chamber 42. As will be described below, this arrangement provides a means for ready antomatic seating of the reservoir closure and permits it some free translational motion should this be necessary.

Figure 3:
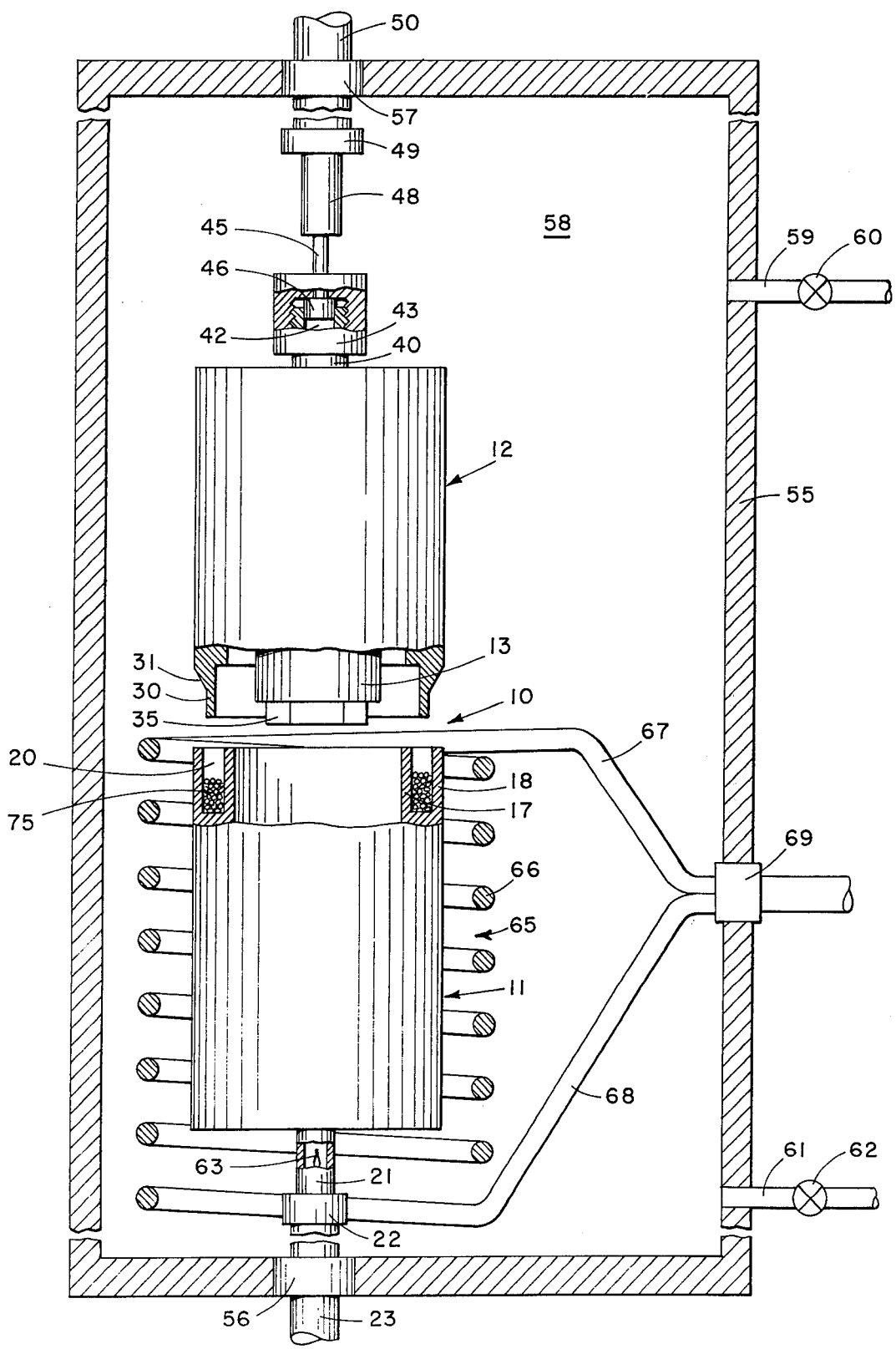
FIG. 3 is a longitudinal cross section through a high-pressure furnace illustrating the assembling of the reaction vessel embodiment of FIG. 1 just prior to a run.

In FIG. 3 the reaction chamber 10 is shown within a pressurized vessel 55 in the position occupied by the vessel components at the time a run is begun. The pressurized vessel 55 is shown diagramatically in FIG. 3. It may be, for example, the high-pressure, high temperature furnace described in U.S. Pat. No. 3,639,718 which permits operations to be carried out therein at temperatures up to 4000°C and pressures ranging from $10^{-5}$ torr to 100 atmospheres. This furnace provides suitable pressure seals 56 and 57 for the lower load-bearing rod 23 and the upper load-bearing rod 50. Pressurizing gas is introduced into furnace volume 58 through an inlet conduit 59, the fluid flow through which is controlled by valve 60. In a similar manner furnace volume 58 is in communication with a vacuum pump through conduit 61, the fluid flow through which is controlled by valve 62. In keeping with known practice, a suitable thermocouple junction 63 is inserted into supporting rod 21 and additional thermocouple junctions are placed at other suitable locations within the furnace volume if desired. The heating means 65 of FIG. 3 is illustrated as rf coils 66 connected through leads 67 and 68 by way of a coupling 69 to a suitable rf power supply (not shown).

To begin a run to make an ingot of polycrystalline GaP, the reservoir-closure 12 is inverted so that the required amount of elemental phosphorus may be introduced into reservoir chamber 32. Then plug 13 is screwed into the reservoir closure thus making it possible to reinvert it and attach it to chuck 49 of load-bearing rod 50 through cap 43, rod 45 and sleeve 48 as shown in FIG. 3. The reservoir-closure 12 is held by rod 50 above enclosure means 11 at this point.

Figure 6:
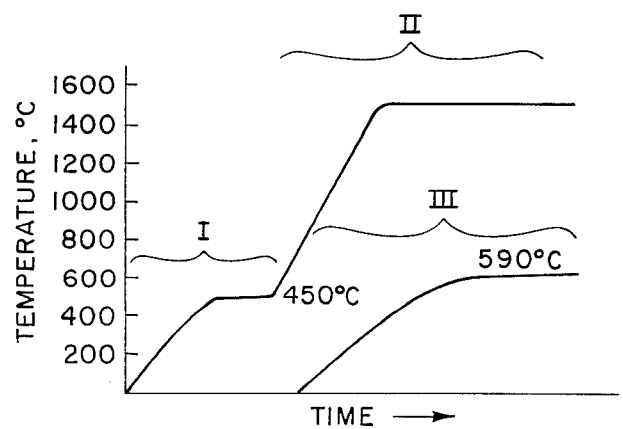
FIG. 6 is a plot of time vs temperature for the heating regimes established.

Enclosure means 11 is attached to load-bearing rod 23 through a chuck 22 and positioned within the upper end of heating means 65 and the power to rf coils 66 is adjusted so that the solid sealant 75 in channel 20 is melted to form a liquid sealant. Exemplary of such a solid sealant is $B_2O_3$ which has a melting point of about 450°C. The melting of the liquid sealant thus constitutes the first heating regime as shown in FIG. 6.

Once the sealant 75 in channel 20 has been liquefied, upper load-bearing rod 50 is moved downwardly to seat the reservoir-closure 12 onto the enclosure means 11 as shown in FIG. 4. Since FIG. 4 represents the position of the reaction vessel 10 in the heater 65 at the time when the melt synthesis reaction is near completion, it should be noted that when the reaction vessel first is closed and the second heating regime (indicated by bracket II of FIG. 6) is begun, the reaction vessel is located in heater 65 as shown in FIG. 3. Seating of reservoir-closure 12 onto enclosure means 11 is done by introducing annular skirt 30 into the liquid sealant 75 and permitting the frustoconical section 31 to rest against the inner edge of rim 18. Liquid sealant 75 thus surrounds essentially all of skirt 30 by virtue of the fact that the skirt is sized to leave spacings between the inside and outside surfaces of the skirt and the walls of channel 20 and to fall short of reaching the bottom of channel 20. Thus there is established a liquid seal around skirt 30 and a mechanical seal between the inner edge of rim 18 and the surface of frustoconical section 31. It will be seen that this arrangement provides for relatively easy alignment.

After the reservoir-closure 12 has been moved downwardly to seat on the enclosure means, the upper load-bearing rod 50 is moved downwardly to position head 46 of supporting rod 45 well into chamber 42 of connector piece 40. This causes reservoir-closure to rest with its full weight supported by enclosure means 11. If a surge of high-pressure gas from reaction chamber 14 should unexpectedly force itself through liquid sealant 75, reservoir-closure 12 would be free to move upwardly and then drop back in proper alignment. In addition, this arrangement provides automatic compensation for any slight differences which may arise in the speed at which the upper and lower load bearing rods are moved translationally.

Because the sealant is positioned outside the reaction chamber 14 and is held above the level of the reactants within the chamber, it is possible to melt it and derive the benefit of its sealing ability prior to the heating of the reactants according to the second and third regimes. This in turn means that the mechanical and liquid seals plus the pressurized gas around the vessel are most efficiently used to prevent leakage of the volatile component from the reaction chamber and that there can be no contamination of the reaction product by the liquid sealant. These facts in turn mean that the compositiion and purity of the final intermetallic compound can be accurately controlled and reproduced.

In the second heating regime it is necessary to bring the gallium (molten mass 76) in crucible 15 up to the melt synthesis temperature, i.e., slightly above the melting point of GaP or up to about 1500°C. The power to the rf coils 66 is adjusted to accomplish this. As this is being done the third heating regime, i.e., the heating of the phosphorus 77 is begun. This regime is indicated by bracket III of FIG. 6. As noted above, just after the reaction vessel is sealed it is positioned in the upper portion of heater 65 which means that heating of phosphorus 77 is begun through radiation rather than directly by coils 66. As the phosphorus 77 is heated radiatively it develops vapor pressure sufficient to drive phosphorus vapor through gas channel 37 in plug 13 into reaction chamber 14. Thus as will be seen in FIG. 6, there is a time overlap for the second and third heating regimes. By maintaining the molten mass 76, which in the beginning is pure gallium and in the end is GaP, at or slightly above the melt temperature of GaP, the reaction of P + Ga → GaP proceeds very rapidly with no real gas diffusion problems.

The temperature of the molten mass 76 is continually monitored by thermocouple 63 or by any other suitable means. As the reaction between the phosphorus vapor and molten gallium proceeds, the temperature of the phosphorus reservoir is gradually raised. In this heating, the pressure of the elemental phosphorus in the reaction vessel is never increased to the point where it exceeds the pressure capabilities of the furnace. The rate of heating of the phosphorus is controlled to be sufficiently slow so that the phosphorous vapor delivered to the reaction chamber is immediately gettered by the molten gallium to form GaP. Raising of the phosphorus temperature is accomplished by lowering the reaction vessel into the rf coils to the position shown in FIG. 4. This imparts a driving force to the phosphorus, making it possible to react essentially all of the phosphorus in the reservoir. This in turn means that the amount of phosphorus required is the stoichiometric quantity plus a small allowance for the volume within the reaction vessel which is filled with phosphorus vapor at the end of the run. With the depletion of the phosphorus supply in reservoir 12, its temperature may be rasied without fear of excessive pressure buildup in the reaction vessel.

At any time during the melt synthesis reaction pressures within the vessel and around it are equalized by diffusion of gases through the seals since they are not of a character to handle the pressures encountered. This equalization of pressures means that the dangers of explosions or implosions are minimized. It also means that the reaction vessel walls do not have to be able to withstand large pressure differentials. Thus little, if any, consideration need be given to the use of a suitable ratio of vessel wall thickness to reaction chamber volume; and relatively large batches of material may be handled. Under some abnormal conditions, a small amount of the volatile component, e.g., phosphorus may be lost to the surrounding atmosphere as evidenced by a slight bubbling of the liquid sealant. However, the actual quantity is small and may be compensated for in determining the quantities of reactants used. If the same rate of heating is used for a series of runs to produce the same intermetallic compound, then the composition of the final products should be reproducibly accurate.

Upon completion of the reaction it may be desirable to hold the melt at the reaction temperature for a period of time, e.g., from a few minutes to about ½ hour, to ensure completion of the reaction. If a polycrystalline product is desired, then the molten GaP product can be quenched relatively rapidly by turning off the heating means, e.g., the power to rf coils. In some cases it may be desirable to repeat the heating and cooling cycle to ensure complete reaction. The product is removed as an ingot from the reaction vessel. Alternatively, the melt may be directionally solidified using the Bridgman-Stockbarger method to produce a single crystal or a large polycrystalline ingot. A reaction vessel suitable for this is illustrated in FIG. 5.

In addition to graphite, the reaction vessel may be constructed from a number of other materials including boron nitride, quartz, high-melting metals such as molybdenum and tantalum, and refractories such as alumina, zirconia and titania. If rf heating is used, then a portion of the reaction vessel may be constructed of graphite to serve as a susceptor for the rf radiation. However, if the reactants, or the reaction product, are of a nature to react with or be contaminated by graphite, then the vessel and plug may be lined with an inert material in any suitable manner. Heating means other than an rf coil may be used. Such heating means include, but are not limited to, resistance heaters, lasers, and the like, the use of resistance heaters being shown in FIG. 5.

A number of different sealants may be used. These include, but are not limited to boric oxide ($B_2O_3$), barium oxide and these oxides in admixture with barium chloride and sodium fluoride, potassium chloride, sodium chloride and the like. The density of the molten sealant is not important, nor is its reactivity with the metal reactants or resulting reaction product important. The sealant should, however, be a compound which melts below the reaction temperature and which has a very low vapor pressure over the temperature range at which it is used.

Figure 5:
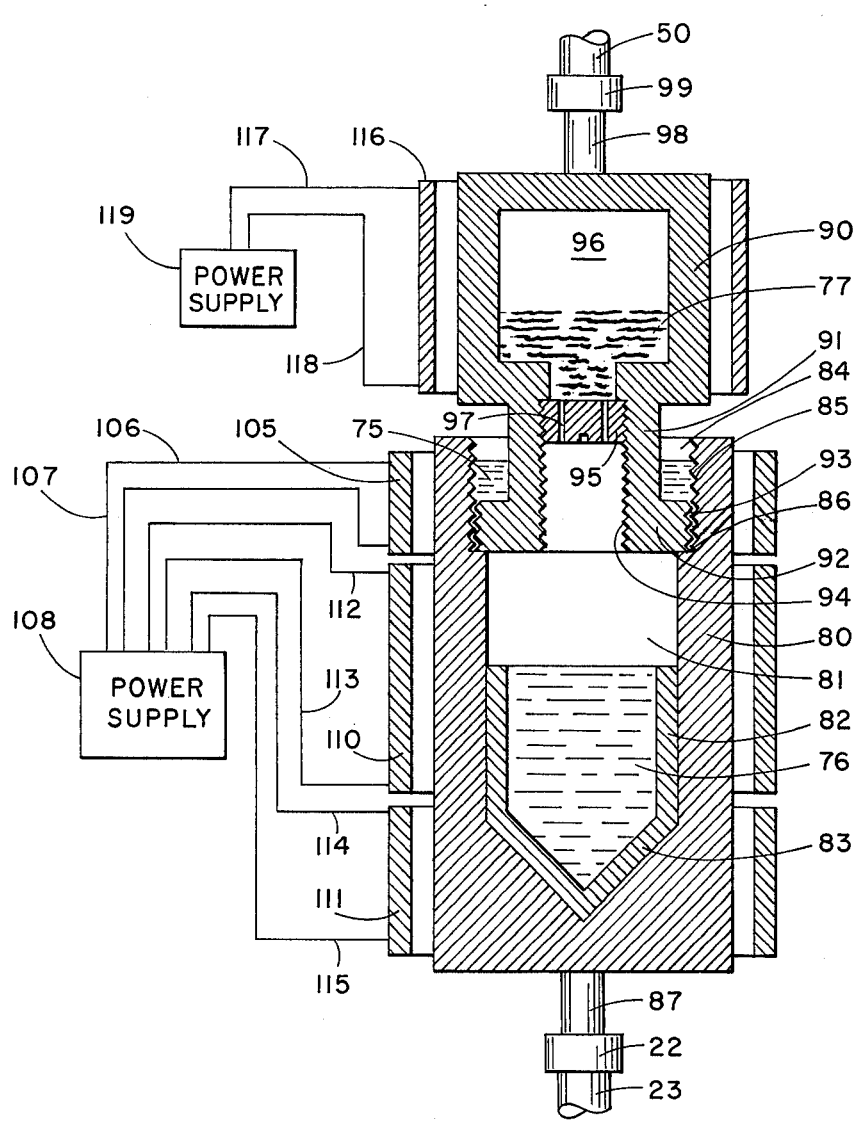
FIG. 5 is a longitudinal cross section through another embodiment of the reaction vessel of this invention during melt synthesis showing the use of heating means which permit controlled crystallization of the product material.

The embodiment of the apparatus of this invention illustrated in FIG. 5 provides for another type of mechanical seal, separate heating means for the various heating regimes (including a fourth regime) and for controlled crystallization of the GaP reaction product. It will, of course, be appreciated that the reaction vessel is placed within the working chamber of a high-pressure furnace or similar device, such as shown in FIG. 3, so that the atmosphere around it may be controlled.

The enclosure means 80 is internally configured to contain within its reaction chamber 81 a crucible 82 with a conically-shaped bottom 83 designed to achieve directional cooling. The upper access opening 84 of the enclosure means is internally threaded at 85 and terminates in an inwardly directed shoulder 86. Enclosure means 80 has a support 87 adapted for attachment to a load-bearing rod 23 through chuck 22 as in the apparatus of FIG. 1.

The reservoir-closure 90, containing phosphorus 77, has a neck section 91 which terminates in a larger-diameter mechanical sealing section 92 having external threads 93 loosely engageable with threads 84 of the enclosure means. The neck section 91 is internally threaded at 94 to receive a threaded plug 95 for closing the internal volume 96 of reservoir-closure 90. Plug 95 has gas channels 97 to provide fluid communication between reservoir volume 96 and reaction chamber 81. Reservoir-closure 90 has a supporting rod 98 which is connected to an upper load-bearing rod 50 through a chuck 99.

The heating regimes are attained in the apparatus of FIG. 5 through a plurality of heating means shown to be resistance heaters. Thus for the first heating regime there is provided resistance heater 105 connected by lead wires 106 and 107 to a power supply 108. Heater 105 surrounds the upper portion of enclosure means 80 to melt the sealant 75 which is contained within the annular spaced defined by the lower end of neck section 91 of the reservoir-closure and the threaded wall 85 of the access opening. For the second heating regime (formation and maintenance of molten mass 76) there are provided two adjacent heaters 110 and 111 connected to power supply 108 by lead wires 112 and 113, and 114 and 115, respectively. These heaters are separate so that heater 111 may be individually regulated during a fourth heating regime when the GaP in the bottom of the crucible is controllably cooled to begin directional cooling. The third heating regime (vaporizing phosphorus 77) is achieved through the use of resistance heater 116 connected by lead wire 117 and 118 to a power supply 119.

In using the reaction vessel of FIG. 5, it is first disassembled, the reservoir-enclosure is inverted, the required amount of phosphorus placed in reservoir 96 and plug 95 screwed in place. The required amount of gallium is placed in crucible 82 and it is placed in the enclosure 80. The enclosure and reservoir-enclosure are then placed separately in a glove-box. The box is evacuated and then nitrogen or some other appropriate pressurizing gas is introduced into the glove-box to a pressure of about one atmosphere. The reservoir-closure is then screwed into the threaded section to make a tight mechanical seal with the shoulder 86, thus essentially retaining the pressurizing gas within the reaction vessel. The assembled vessel is removed from the glove-box, a quantity of sealant (normally in solid form) is placed in the annular volume and the entire assembly is positioned on load-bearing rod 23 located within the working chamber of the furnace or other suitable pressurizable device. The furnace is then pressurized with the same gas introduced into the reaction vessel until the pressure surrounding the reaction vessel is equal to or greater than the maximum vapor pressurized to be developed by the phosphorus at any time during the melt synthesis.

To begin the synthesis, power to resistance heater 105 is turned on to melt sealant 75. This heater is left on throughout the synthesis to ensure that the sealant remains liquid. A small amount of the sealant may work its way between threads 85 and 93. However, even if it does penetrate to the bottom of sealing its section 92 entry into chamber 81 will be blocked by the seal around shoulder 86. There is thus established a mechanical-liquid seal as described in connection with FIG. 4. Subsequent to the establishment of this seal, heaters 110 and 111 are turned on to effect the second heating regime, i.e., the formation of the gallium into a molten mass at about 1500°C. Finally, heater 116 is turned on to vaporize the phosphorus and gradually raise its temperature to about 590°C, thus effecting the third heating regime. GaP is soluble in molten Ga and as it forms it collects on the bottom of the molten mass 76. When essentially all of the GaP has formed, the power to heater 111 is gradually decreased to begin the directional cooling of the GaP in the conical section 83 of crucible 82. With the completion of the synthesis of the GaP, power to heaters 116 and 105 is turned off and that to heater 110 decreased to complete the controlled cooling and crystallization of the GaP.

It is, of course, within the scope of this invention to combine or interchange features of the reaction vessels illustrated. Thus one or more resistance heaters may be used with the reaction vessel of FIGS. 1–4, regulating power to them as described for the apparatus of FIG. 5 in place of moving the reaction vessel during a run to achieve directional cooling if desired. Likewise, rf heating means may be used with the reaction vessel of FIG. 5.

By sealing the reaction vessel, both mechanically and with a liquid sealant, in a manner to permit the diffusion of high-pressure gases through the seal it is possible to maintain the pressures within and outside of the reaction vessel at essentially the same level, thus eliminating the need for a thick-walled vessel and thus permitting relatively large batches to be handled. By using a liquid sealant instead of an encapsulant and by maintaining the sealant above the reactants and out of contact with them it is possible to make full use of the sealing properties of the sealant before any appreciable amount of vapor pressure is developed by one or more of the reactants and to prevent any contamination of the reaction product. Furthermore, by isolating the volatile phosphorus from the molten reaction mass it is possible to rapidly synthesize GaP within the physical limits of presently available high-pressure furnaces. The amount of phosphorus contamination within the furnace is kept to a minimum and the apparatus is of a nature which makes it safely operable by a technician.

It will thus be seen that the objects set forth above, among those made apparent from the preceding description, are efficiently attained and, since certain changes may be made the above constructions without departing from the scope of the invention, it is intended that all matter contained in the above description or shown in the accompanying drawings shall be interpreted as illustrative and not in a limiting sense.

We claim:

1. A reaction vessel suitable for carrying out the melt synthesis of an inorganic compound formed by reacting elemental reactants, at least one of which is essentially nonvolatile and at least another of which is volatile at elevated temperatures, comprising in combination
   a. enclosure means defining a reaction chamber for containing a molten mass of said nonvolatile reactant and of said inorganic compound and having an upper access opening;
   b. reservoir-closure means defining a reservoir for said volatile reactant, engageable with said upper access opening thereby to form a mechanical seal and having a removable plug defining the bottom of said reservoir-closure means and fluid communication means in said plug through which said volatile reactant may be introduced as a gas into said reaction chamber above said molten means; and
   c. liquid sealant channel means associated with said mechanical seal to define therewith a combination liquid-mechanical seal of a character which prevents said liquid sealant from entering said reaction chamber but which permits the diffusing of high-pressure gases therethrough.

2. A reaction vessel in accordance with claim 1 wherein said liquid sealant channel means comprises an annular groove in said enclosure means defined between an outside rim and an inside rim around said access opening and said reservoir-closure means has a bottom skirt section extendable into said liquid sealant channel and connected to the sidewall of said reservoir-enclosure means through a frustoconical section providing a mechanical sealing surface engageable with the inner edge of said outside rim to form said mechanical seal.

3. A reaction vessel in accordance with claim 2 including upper support means for permitting said reservoir-closure means to undergo temporary small translational movement when engaged with said enclosure means.

4. A reaction vessel in accordance with claim 1 wherein said upper access opening is threaded and terminates in an inwardly directed shoulder and said reservoir-closure means has a neck section terminating in a threaded sealing section engageable with said upper access opening to form said mechanical seal with said shoulder and to define said liquid sealant channel means between said neck section and said upper access opening.

5. A reaction vessel in accordance with claim 4 wherein said neck section is internally threaded, said removable plug is threadably engageable therewith and said fluid communication means comprise gas channels through said plug.

6. A reaction vessel in accordance with claim 1 including crucible means within said reaction chamber.

7. A reaction vessel in accordance with claim 6 wherein said crucible means terminates at the lower end in a conical configuration.

8. An apparatus for carrying out the melt synthesis of an inorganic compound formed by reacting elemental reactants, at least one of which is essentially nonvolatile and at least another of which is volatile at elevated temperatures comprising in combination
  a. a reaction vessel comprising in combination
    1. enclosure means defining a reaction chamber for containing a molten mass of said nonvolatile reactant and of said inorganic compound and having an upper access opening,
    2. reservoir-closure means defining a reservoir for said volatile reactant, engageable with said upper access opening thereby to form a mechanical seal and having a removable plug defining the bottom of said reservoir-closure means and fluid communication means in said plug through which said volatile reactant may be introduced as a gas into said reaction chamber above said molten mass, and
    3. liquid sealant channel means associated with said mechanical seal to define therewith a combination liquid-mechanical seal of a character which prevents said liquid sealant from entering said reaction chamber but which permits the diffusion of high-pressure gases therethrough; and
  b. heating means for attaining at least three heating regimes in the following order: (I) the liquefaction of sealant in said liquid sealant channel, (II) the formation and maintenance of a molten mass within said reaction chamber at the temperature at which said reacting is carried out, and (III) the vaporization of said volatile elemental reactant.

9. An apparatus in accordance with claim 8 wherein said heating means comprises a single heater surrounding at least a portion of said reaction vessel and means are provided to effect relative motion between said heating means and said reaction means.

10. An apparatus in accordance with claim 8 wherein said heating means comprises individual heaters associated with said liquid sealant channel means, said reaction chamber and said reservoir-closure means.

11. An apparatus in accordance with claim 8 wherein said heating means comprises rf coils.

12. An apparatus in accordance with claim 8 wherein said heating means comprise electrical resistance heating means.

13. An apparatus in accordance with claim 8 wherein said liquid sealant channel means comprises an annular groove in said enclosure means defined between an outside rim and an inside rim around said access opening and said reservoir-closure means has a bottom skirt section extendable into said liquid sealant channel and connected to the sidewall of said reservoir-enclosure means through a frustoconical section providing a mechanical sealing surface engageable with the inner edge of said outside rim to form said mechanical seal.

14. A reaction vessel in accordance with claim 8 including upper support means for permitting said reservoir-closure means to undergo temporary small translational movement when engaged with said enclosure means.

15. A reaction vessel in accordance with claim 8 wherein said upper access opening is threaded and terminates in an inwardly directed shoulder and said reservoir-closure means has a neck section terminating in a threaded sealing section engageable with said upper access opening to form said mechanical seal with said shoulder and to define said liquid sealant channel means between said neck section and said upper access opening.

16. A reaction vessel in accordance with claim 15 wherein said neck section is internally threaded, said removable plug is threadably engageable therewith and said fluid communication means comprise gas channels through said plug.

17. A reaction vessel in accordance with claim 8 including crucible means within said reaction chamber.

18. A reaction vessel in accordance with claim 17 wherein said crucible means terminates at the lower end in a conical configuration.

* * * * *